(12) United States Patent
Shin et al.

(10) Patent No.: US 8,036,050 B2
(45) Date of Patent: Oct. 11, 2011

(54) CIRCUIT FOR TRANSMITTING AND RECEIVING DATA AND CONTROL METHOD THEREOF

(75) Inventors: Sun-Hye Shin, Gyeonggi-do (KR); Sung-Joo Ha, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 477 days.

(21) Appl. No.: 12/337,549

(22) Filed: Dec. 17, 2008

(65) Prior Publication Data
US 2010/0056066 A1    Mar. 4, 2010

(30) Foreign Application Priority Data
Sep. 1, 2008   (KR) .......................... 10-2008-0085850

(51) Int. Cl.
*G11C 7/00* (2006.01)
(52) U.S. Cl. ........................................ 365/191; 365/194
(58) Field of Classification Search .................. 365/191, 365/194, 189.14, 189.15; 455/68
See application file for complete search history.

(56) References Cited

U.S. PATENT DOCUMENTS

| | | | | |
|---|---|---|---|---|
| 6,317,377 B1* | 11/2001 | Kobayashi | ..... | 365/220 |
| 7,319,730 B2* | 1/2008 | Okuda et al. | ..... | 375/355 |
| 2006/0233031 A1* | 10/2006 | Jakobs | ..... | 365/198 |

FOREIGN PATENT DOCUMENTS

| | | |
|---|---|---|
| JP | 2000-048567 | 2/2000 |
| KR | 1020060062426 A | 6/2006 |

OTHER PUBLICATIONS

Notice of Allowance issued from Korean Intellectual Property Office on Mar. 30, 2010.

* cited by examiner

*Primary Examiner* — Vu Le
(74) *Attorney, Agent, or Firm* — IP & T Group LLP

(57) ABSTRACT

A data receiving circuit includes a delay unit for outputting a delayed control signal by delaying a control signal based on a CAS latency, an output driver for time-dividing parallel data based on the control signal and the delayed control signal to generate divided parallel data, and for writing and transmitting the divided parallel data, and a latch for receiving the parallel data from the output driver and sorting, by combining or dividing, the received parallel data in response to the control signal and the delayed control signal.

18 Claims, 6 Drawing Sheets

CIRCUIT FOR TRANSMITTING AND RECEIVING DATA AND CONTROL METHOD THEREOF

CROSS-REFERENCE TO RELATED APPLICATION

The present invention claims priority of Korean patent application number 10-2008-0085850, filed on Sep. 1, 2008, which is incorporated by reference in its entirety.

BACKGROUND OF THE INVENTION

The present invention relates to a semiconductor design technology, and more particularly, to a data output circuit for outputting internal information data such as a vendor ID through an input/output pad.

A double data rate synchronous dynamic random access memory (DDR SDRAM) employs the specification of SDRAM that exchanges data not only at a rising edge but also at a falling edge of a clock. Therefore, the DDR SDRAM operates at a higher speed than that of a single data rate (SDR) SDRAM that exchanges data with an external device only at a rising edge of a clock. However, there is a limitation to increase an operation speed of an internal circuit of SDRAM. In order to overcome such a limitation, a prefetch method was introduced. In the prefetch method, N-bit input/output data is prefetched and stored at each input/output pin DQ. Then, the stored N-bit input/output data is loaded at each rising/falling edge of a clock when data is inputted or outputted.

Such a prefetch method includes not only a 2-bit prefetch method for prefetching and storing two-bits per each input/output pin DQ but also 4-bit and 8-bit prefetch methods for prefetching and storing 4-bit or 8-bit data per each input/output pin DQ. The DDR2 SDRAM employs the 4-bit prefetch method for inputting and outputting 4-bit data during two clock cycles, that is, rising/falling edges of four consecutive clocks. A DDR3 SDRAM employs the 8-bit prefetch method for inputting and outputting 8-bit data during four clock cycles, that is, rising/falling edges of 8 consecutive clocks.

Since the prefetch method must latch a plurality of data at the same time, more internal data transmission lines are required. Therefore, a 8-bit prefetch type SDRAM includes internal data transmission lines two times more than that in a 4-bit prefetch type SDRAM. However, data must be processed with an enough margin in the SDRAM because the clock cycle required for inputting and outputting corresponding prefetched data increases as the number of transmission lines increases. Therefore, the prefetched data is divided based on a time division method and transmitted in order to reduce the number of data transmission lines.

FIGS. 1 and 2 are diagrams illustrating a typical data transmitting and receiving circuit of a semiconductor memory device for describing a write operation and a read operation. FIGS. 1 and 2 show data transmission after 2N-bit parallel data is divided into N-bits of parallel data based on a time division scheme.

FIG. 1 is a diagram for describing a write operation of a semiconductor memory device. As shown in FIG. 1, the data transmitting and receiving circuit includes a first latch 101, an output driver 103, a parallel data line unit 105, and a clock counter 107.

Data serially inputted from an external device to a semiconductor memory device is prefetched by 2N-bit in a pipe latch (not shown) of an input/output interface. The pipe latch transmits the 2N-bits prefetched parallel data to a first line DIO<1:2N> in response to a predetermined strobe signal.

The clock counter 107 generates a first delayed control signal STDD_1 by delaying a first control signal ST_1 obtained from the predetermined strobe signal. The first control signal ST_1 and the first delayed control signal STDD_1 are signals for deciding transmitting and receiving timing of the output driver and the first latch 101. The clock counter 107 counts a clock cycle CLK and delays the first control signal ST_1 as much as a predetermined clock cycle. For example, if the semiconductor memory device employs a 8-bit prefetch method, a first delayed control signal STDD_1 is enabled when two clock cycles CLK passes after the first control signal ST_1 is enabled.

The output driver 103 receives 2N-bit prefetched parallel data, divides the parallel data based on a time division scheme in response to the first control signal ST_1 and the first delayed control signal STDD_1, and outputs N-bit parallel data. Therefore, the parallel data line unit 105 may include as N transmission lines GIO<1:N> instead of 2N transmission lines. The parallel data line unit 105 transmits data in bi-direction in a write operation and a read operation.

The first latch 101 latches N-bit parallel data which is divided based on a time division scheme and transmitted in response to a first control signal ST_1 and a first delayed control signal STDD_1 and sorts the latched data as 2N-bit parallel data. When a write driver (not shown) is enabled, the 2N-bit parallel data is transmitted to the second line LIO<1:2N> and stored in a memory cell. Sorting, in general, may include, but is not limited to, dividing parallel data into one or more groups of divided parallel data, or combining one or more groups of divided parallel data into parallel data.

FIG. 2 is a diagram for describing a read operation of a semiconductor memory device. As shown, a data transmitting/receiving circuit includes an input/output sense amp 201, a second latch 203, a parallel data line unit 105, and a delay unit 207.

If a column is selected by a predetermined column selection signal, 2N-bit parallel data is transmitted from the memory cell to the second line LIO<1:2N> and inputted to the input/output sense amp 201.

The delay unit 203 generates a second delayed control signal STDD_2 by delaying a second control signal ST_2 obtained from the predetermined column selection signal. The second control signal ST_2 and the second delayed control signal STDD_2 decide transmitting and receiving timings of the input/output sense amp 201 and the second latch 203. The 2N-bit parallel data and the clock CLK are transferred through different paths. Therefore, it is difficult to delay the second control signal ST_2 as much as a predetermined delay amount using the clock counter 107 used in a write operation because the delay amounts of the 2N-bit parallel data and the clock CLK vary according to a corresponding path. Therefore, if the semiconductor memory device employs the 8-bit prefetch method, the second control signal ST_2 is delayed by the delay unit 203 that has a predetermined delay amount as much as two clock cycles CLK based on the highest operation frequency of a semiconductor memory device in a write operation and a read operation.

The input/output sense amp 201 receives 2N-bit parallel data, divide the receive 2N-bit parallel data based on a time division scheme in response to the second control signal ST_2 and the second delayed control signal STDD_2 and outputs N-bit parallel data. Therefore, the parallel data line unit 105 may include N transmission lines GIO<1:N> instead of 2N transmission lines.

The second latch 203 latches N-bit parallel data in response to the second control signal ST_2 and the second delayed control signal STDD_2, sorts the latched N-bit parallel data to 2N-bit parallel data, and outputs the 2N-bit parallel data to an input/output interface (not shown).

FIG. 3 is a timing diagram for describing a write operation and a read operation of a data transmitting and receiving circuit of FIGS. 1 and 2. That is, FIG. 3 shows a timing diagram for a write operation and a read operation of a data transmitting and receiving circuit employing a 8-bit prefetch method at radio frequency where N=4.

In case of a write operation, an output driver 103 divides 8-bit prefetched data D1 to D8 based on a time division scheme, and transmits 4-bit data D1, D2, D3, and D4 among the 8-bit perfected data D1 to D8 through four transmission lines GIO<1:4> of a parallel data line unit 105 in response to the first control signal ST_1. After two clock cycles CLK, the output driver 103 transmits remaining 4-bit data D5, D6, D7, and D8 through four transmission lines GIO<1:4> of the parallel data line unit 105 in response to the first delayed control signal STDD_1 which is enabled by the clock counter 107.

In case of a read operation, the input/output sense amp 201 divides 8-bit parallel data D1 to D8 outputted from a memory cell based on a time division scheme, and transmits 4-bit data D1 to D4 among 8-bit parallel data D1 to D8 in response to the second control signal ST_2 through four transmission lines GIO<1:4> of the parallel data line unit 105. After two cycles of a clock CLK, the input/output sense amp 201 transmits remaining 4-bit data D5, D6, D7, and D8 in response to the second delayed control signal STDD_2 enabled by the delay unit 203 through four transmission lines GIO<1:4> of the parallel data line unit 105.

FIG. 4 is a timing diagram for describing a write operation and a read operation of a data transmitting and receiving circuit of FIGS. 1 and 2, which employs a 8-bit prefetch method at a low frequency where N=4.

In case of a write operation, a margin of time-divided and transmitted data is uniform because the clock counter counts a clock cycle CLK and the first delayed control signal STDD 1 is enabled.

In case of a read operation, however, a margin of time-divided and transmitted data is not uniform when a delay amount of the delay unit 203 is adjusted to two clock cycles of a high frequency of FIG. 3. That is, in case of a data transmitting circuit according to the related art, margins of the parallel data D1 to D4 transmitted in response to the second control signal ST_2 are reduced compared to margins of parallel data D5 to D8 transmitted in response to the second delayed control signal STDD_2. Therefore, an error may occur in transmitting data.

Also, the data transmission circuit according to the related art has a problem of high power consumption because the clock counter 107 always counts the clocks CLK in regardless of the operations of the output driver 103.

SUMMARY OF THE INVENTION

Embodiments of the present invention are directed to providing a data transmitting/receiving circuit and a control method thereof for uniformly sustaining a margin of parallel data that is divided based on a time division scheme and transmitted, and for reducing power consumption.

In accordance with an aspect of the present invention, there is provided a data receiving circuit including a delay unit for delaying a control signal based on a CAS latency and to output a delayed control signal by, an output driver configured to time-divide parallel data based on the control signal and the delayed control signal to generate divided parallel data, and to write and transmit the divided parallel data, and a latch configured to receive the divided parallel data from the output driver in response to the control signal and the delayed control signal and combine the received parallel data.

In accordance with another aspect of the present invention, there is provided a data transmitting circuit including a delay unit for delaying a control signal based on a CAS latency and to generate a delayed control signal, an input/output sense amp unit configured to time-divide parallel data based on the control signal and the delayed control signal to generate divided parallel data, and to read and transmit the divided parallel data, and a latch configured to receive the divided parallel data from the input/output sense amp unit in response to the control signal and the delayed control signal, and to combine the divided parallel data.

In accordance with another aspect of the present invention, there is provided a data transmitting and receiving circuit including a first delay unit delaying a first control signal in response to a CAS latency to generate a first plurality of delayed control signals, a second delay unit for delaying a second control signal in response to the CAS latency and to generate a second plurality of delayed control signals, and a data transmitting and receiving unit configured to time-divide the first and second parallel data in response to the control signal and the plurality of delayed control signals.

In accordance with another aspect of the present invention, there is provided a data transmitting and receiving method including delaying a control signal based on a CAS latency to generate a delayed control signal, time-dividing first parallel data in response to the control signal and the delayed control signal to generate second parallel data, transmitting the second parallel data, receiving the second parallel data in response to the control signal and the delayed control signal, and combining the second parallel data and the first parallel data by storing the second parallel data.

DESCRIPTION OF SPECIFIC EMBODIMENTS

Other objects and advantages of the present invention can be understood by the following description, and become apparent with reference to the embodiments of the present invention.

Figure 1:
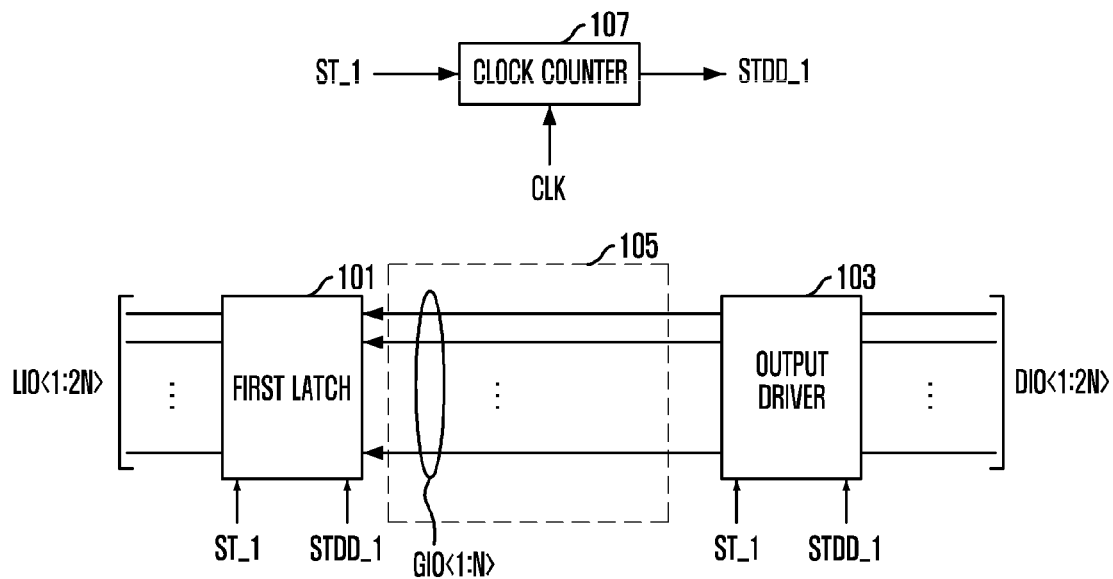
FIG. 1 is a block diagram illustrating a typical data transmitting and receiving circuit of a semiconductor memory device for describing a write operation.
Figure 2:
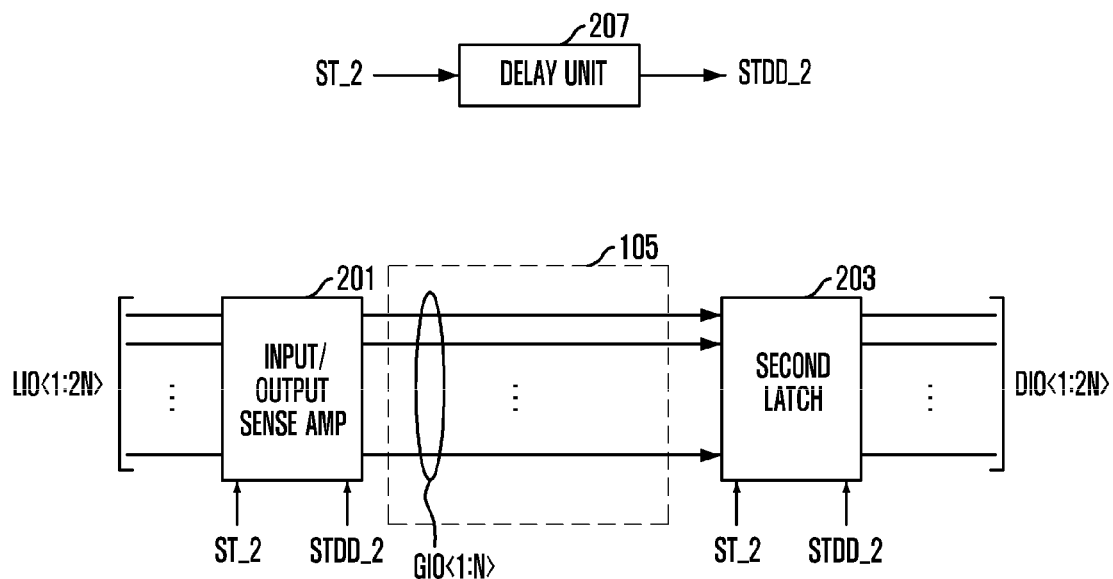
FIG. 2 is a block diagram illustrating a typical data transmitting and receiving circuit of a semiconductor memory device for describing a read operation.
Figure 3:
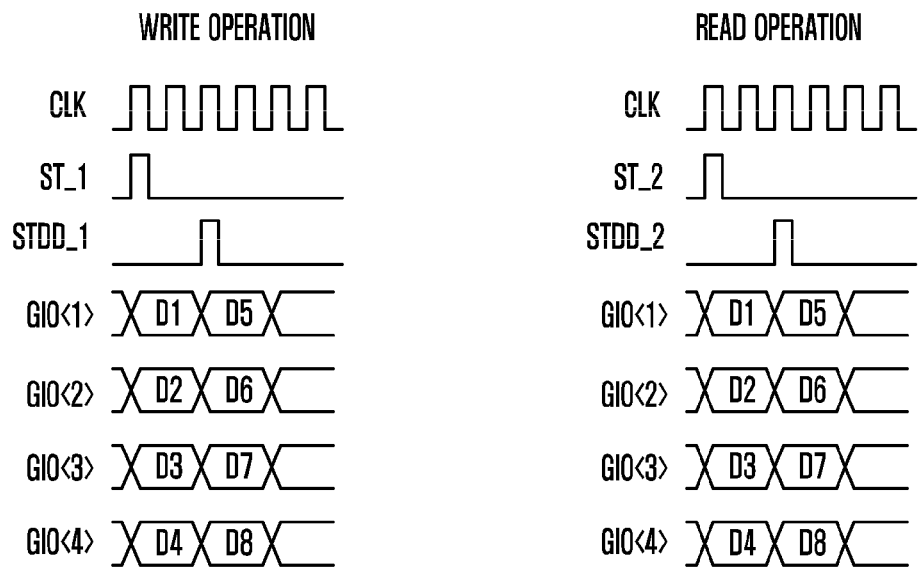
FIG. 3 is a timing diagram for describing a write operation and a read operation of a data transmitting and receiving circuit of FIGS. 1 and 2 at a high frequency.
Figure 4:
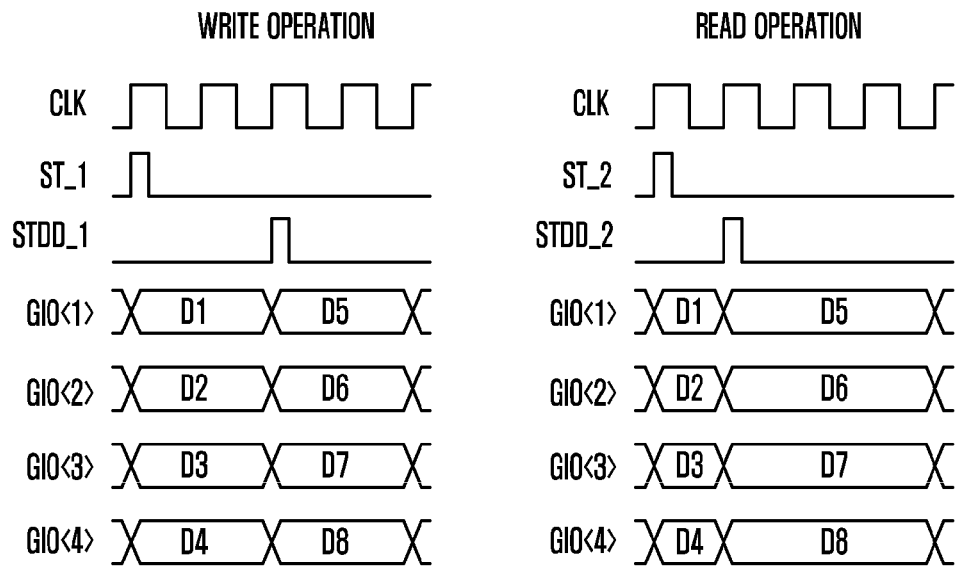
FIG. 4 is a timing diagram for describing a write operation and a read operation of a data transmitting and receiving circuit of FIGS. 1 and 2 at a low frequency.
Figure 5:
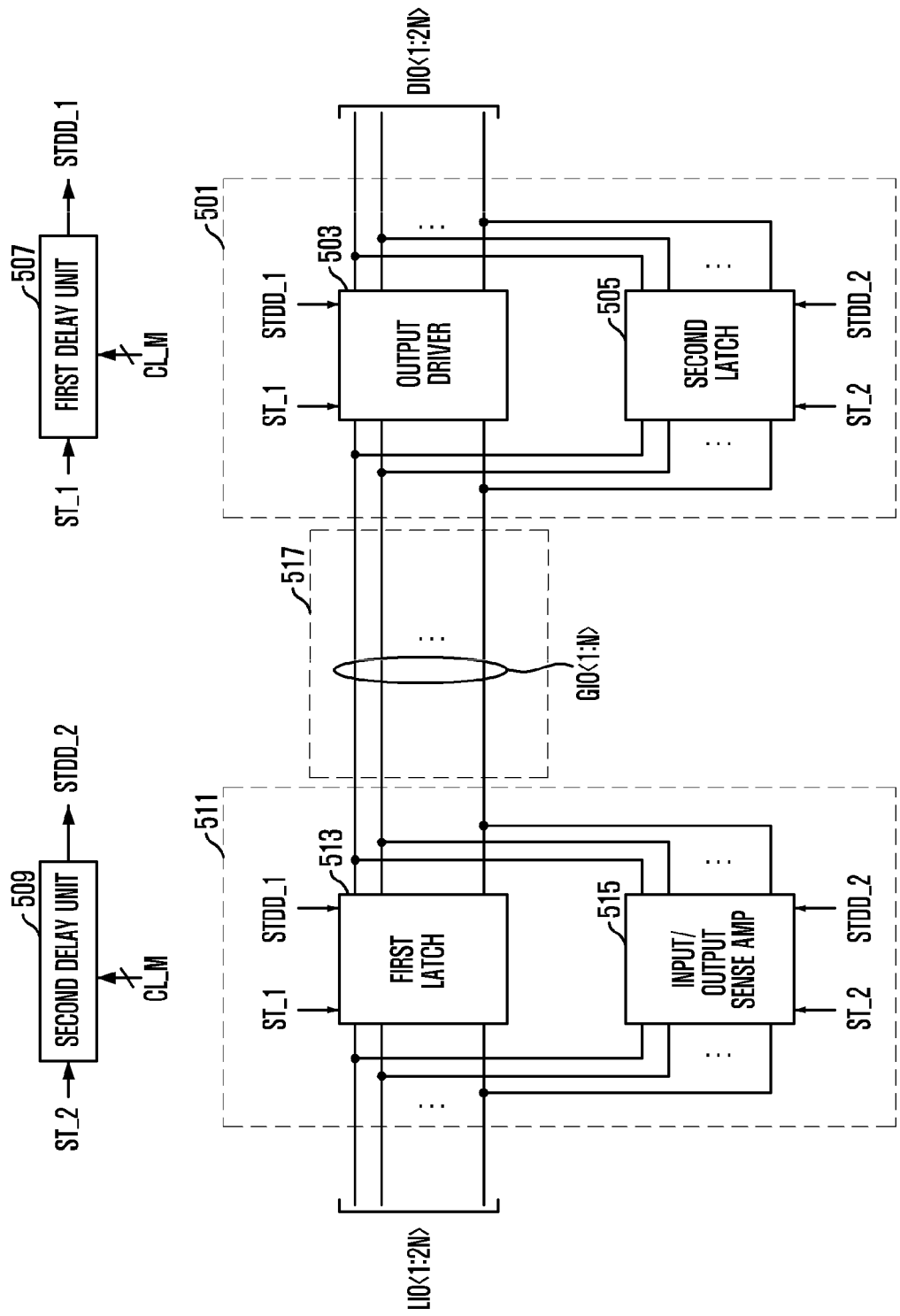
FIG. 5 is a diagram illustrating a data transmitting and receiving circuit in accordance with an embodiment of the present invention.

FIG. 5 is a diagram illustrating a data transmitting and receiving circuit in accordance with an embodiment of the present invention.

As shown in FIG. 5, the data transmitting and receiving circuit according to the present embodiment includes a first transmitting and receiving unit 501, a second transmitting and receiving unit 511, a first delay unit 507, a second delay unit 509, and a parallel data line unit 517.

The first transmitting and receiving unit 501 includes an output driver 503 for a write operation of a semiconductor memory device and a second latch 505 for a read operation. The second transmitting and receiving unit 511 includes a first latch 513 for a write operation of a semiconductor memory device and an input/output sense amp 515 for a read operation.

An output driver 503 of the first transmitting and receiving unit 501 divides 2N-bit perfected parallel data, which is transmitted through a first line DIO<1:2N>, using a time division scheme and transmits the divided parallel data. The first latch 513 of the second transmitting and receiving unit 511 receives the transmitted data. The input/output sense amp 515 of the second transmitting and receiving unit 511 divides 2N-bit parallel data, which is transmitted through the second line LIO<1:2N>, using a time division scheme, and transmits the divided parallel data. The second latch 505 of the first transmitting and receiving unit 501 receives the time-divided data. Operations of the first and second transmitting and receiving units 501 and 505 will be described with reference to FIGS. 7 and 8 in later.

The parallel data line unit 517 connects the first transmitting and receiving unit 501 and the second transmitting and receiving unit 511 through the third line GIO<1:N> and transmits the divided N-bit data in bi-directions.

The first delay unit 507 generates a first delayed control signal STDD_1 by delaying the first control signal ST_1, and the second delay unit 509 generates a second delayed control signal STDD_2 by delaying the second delay signal ST_2. The control signals ST_1 and ST_2 and the delayed control signals STDD_1 and STDD_2 enable the first and second transmitting and receiving units 501 and 511 to transmit and receive 2N-bit parallel data after dividing the 2N-bit parallel data twice by deciding transmitting and receiving timings of the first and second transmitting and receiving units 501 and 511.

Unlike the data transmitting and receiving circuit according to the related art that uses the clock counter 107 and the delay unit 207 according to a write operation and a read operation, the data transmitting and receiving circuit according to the present embodiment includes delay units 507 and 509 for delaying control signals ST_1 and ST_2 according to a frequency of a clock CLK in order to make margins of time-divided and transmitted data. In an embodiment, the delay units 507 and 509 determine a frequency of a clock CLK in response to a CAS latency (CL).

The CL is a clock cycle CLK from receiving a read instruction to outputting data in a semiconductor memory device. For example, if CL is 3, data is outputted to an external device when three clock cycles CLK pass after a read instruction is inputted to a semiconductor memory device. Since there is a limitation to increase an operation speed of an internal circuit of a semiconductor memory device as described above, the CL increases as an operation frequency of a semiconductor memory device increases and the CL decreases as the operation frequency decreases. That is, since the CL interacts with the clock of the semiconductor memory device, the frequency of a clock can be determined based on the CL.

The data transmitting and receiving circuit according to the present embodiment outputs delayed control signals STDD_1 and STDD_2 which are generated by delaying control signals ST_1 and ST_2 as much as a predetermined cycle of a clock corresponding to the CAS latency (CL) based on the CL.

In more detail, the delay units 507 and 509 delay the control signals ST_1 and ST_2 with different delay amounts according to the CL, and select one of a plurality of delayed control signals in response to a CAS latency signal CL_M that indicates a CAS latency corresponding to an operation frequency of a semiconductor memory device, where M denotes a CL corresponding a corresponding clock.

For example, in case that the output driver 503 divides 8N-bit prefetched parallel data twice based on a time division scheme and transmits the divided parallel data, the first delay unit 507 generates the first delayed control signal STDD_1 by delaying the first control signal STDD_1 as much as two clock cycles CLK corresponding to a CAS latency CL and outputs the generated first delayed control signal STDD_1.

Therefore, the data transmitting and receiving circuit according to the present embodiment does not have a problem of irregular margin of parallel data that is time-divided and transmitted according to the operation frequency in a read operation unlike the data transmitting and receiving circuit according to the related art. The data transmitting and receiving circuit according to the present embodiment does not always measure a clock cycle CLK by counting clocks CLK. Therefore, the data transmitting and receiving circuit according to the present embodiment reduces power for toggling a clock always by the clock counter 107.

Each of the first delay unit 507 and the second delay unit 509 can output a plurality of first delayed control signals and second delayed control signals at a predetermined interval according to a clock CLK frequency corresponding to a CAS latency (CL). In this case, 2N-bit parallel data may be divided based on a time division scheme in proportion to the number of the first delayed control signals and the second delayed control signals several times, transmitted or received. That is, the number of bits of the time-divided and transmitted data is in inverse proportion to the number of delayed control signals outputted from the first delay unit 507 and the second delay units 509.

In other words, the first transmitting and receiving unit 501, the parallel data line unit 517, and the second transmitting and receiving unit 511 divide parallel data based on the time division scheme and transmit the divided parallel data in bi-directions by the delayed control signals and the control signals generated by the delay units 507 and 509 in response to the CAS latency CL.

Although the data transmitting and receiving circuit according to the present embodiment divides 2N bit parallel data twice based on the time division scheme, the present invention is not limited thereto. It is obvious to those skilled in the art that the present invention can be applied to any data transmitting and receiving circuit that divides parallel data a plurality of times.

Figure 6:
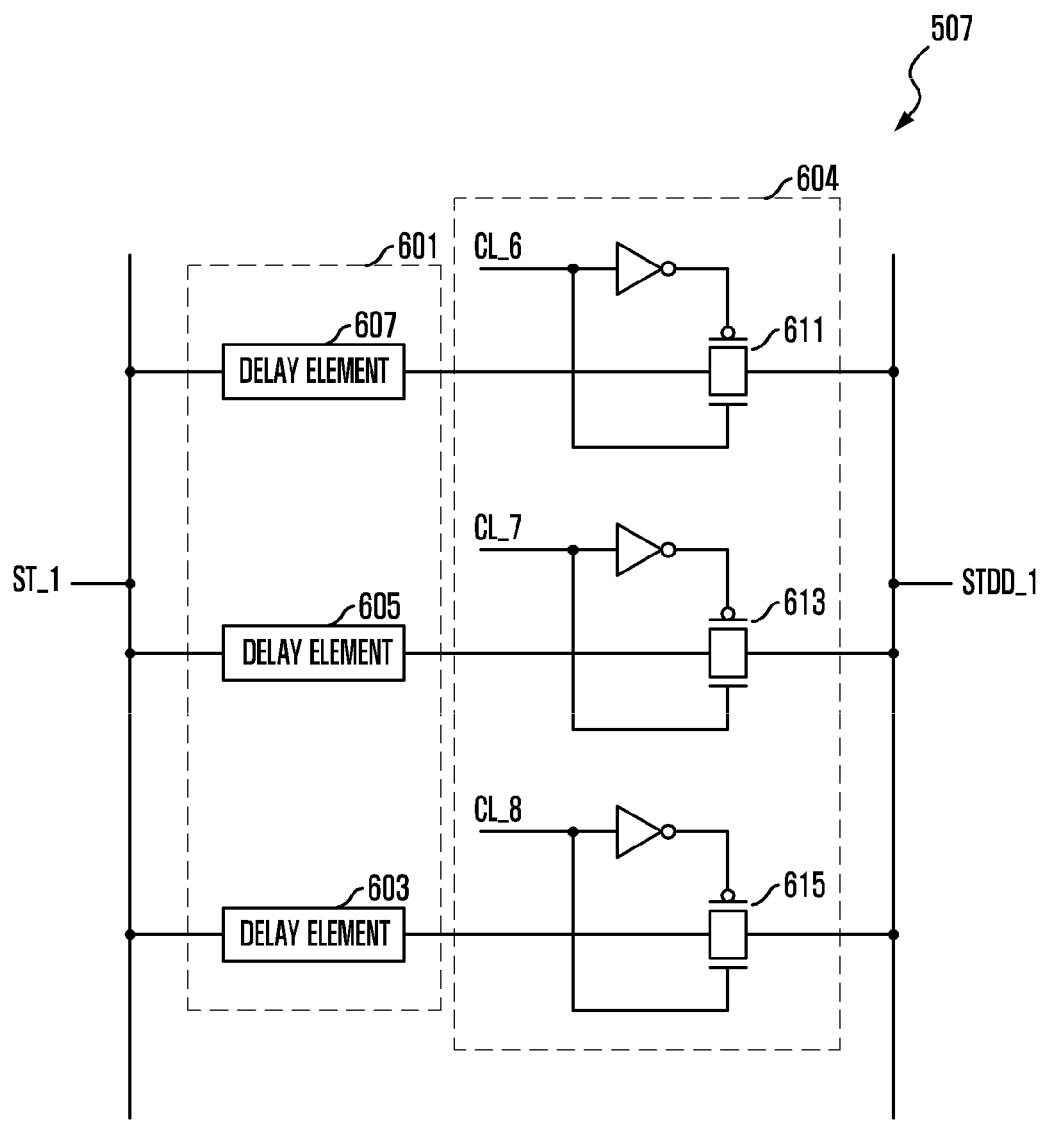
FIG. 6 is a diagram illustrating a first delay unit of FIG. 5.

FIG. 6 is a diagram illustrating a first delay 507 of FIG. 5.

The second delay unit 509 has the same structure of the first delay unit 507. Hereinafter, the first delay unit 507 will be described.

As shown in FIG. 6, the first delay unit 507 includes a delay signal generator 601 for delaying a first control signal ST_1, and a selector 609 selects one of output signals of the delay signal generator 601 as a first delayed control signal STDD_1 in response to a CAS latency CL according to an operation frequency of a semiconductor memory device.

The delayed signal generator 601 includes a plurality of delay elements 603, 605, and 607 for receiving the first control signal ST_1. The plurality of delay elements 603, 604, and 605 delay the first control signal ST_1 with different delay amounts. Delay amounts of the plurality of delays 603, 604, and 605 correspond to predetermined various operation clock cycles CLK corresponding to CAS latency signals CL_6, CL_7, and CL_8. For example, a delay amount of each delay elements 603, 605, and 607 corresponds to two clock cycles in case of a 8-bit prefetch method that 8-bit parallel data is transmitted during four clock cycles. However, since a frequency of a clock CLK is different according to a CAS latency, delay amounts of a plurality of delay elements 603, 605, and 607 are different corresponding to the CAS latency signals CL_6, CL_7, and CL_8. For example, the delay element 603 is related to a CAS latency signal CL_8 corresponding to a comparative high frequency of a clock CLK, and the delay element 607 is related to a CAS latency signal CL_6 corresponding to a comparative low frequency of clock CLK. The delay elements 603 and 607 correspond to two clock cycles CLK. However, the delay amount of the delay element 603 related to the high frequency is smaller than the delay amount of the delay element 607 related to the low frequency. In the drawing, differences of lengths of delay elements 603, 605, and 607 mean the delay amount of the delay elements 603, 605, and 607.

The selector 609 includes a plurality of pass gates 611, 613, and 615 connected to a plurality of delay elements 603, 605, and 607, respectively. Each of the pass gates 611, 613, and 615 is turned-on in response to the CAS latency signals CL_6, CL_7, and CL_8. For example, a plurality of CAS latency signals CL_6, CL_7, and CL_8 are generated according to a CAS latency CL that is set in a mode register set (MRS) for controlling various operation modes of a semiconductor memory device. As the operation frequency becomes higher, the CAS latency signal CL_M representing high CAS latency CL is enabled to a high level.

FIG. 6 shows embodiments for three CAS latencies. If the operation frequency of the semiconductor memory device is high, the CAS latency signal CL_8 representing the high CAS latency CL is enabled to a high level. The selector 609 selects the least delayed one among the output signals of the delay element 603 as the first delayed control signal STDD_1. If the operation frequency of the semiconductor memory device is low, the CAS latency signal CL_6 representing a low CAS latency CL is enabled to a high level, and the selector 609 selects the most delayed output signal of the delay element 607 as the first delayed control signal STDD_1.

In other word, the delay amount of the first delayed control signal STDD_1 selected and outputted from the first delay unit 507 is in inverse proportion to an operation frequency of a semiconductor memory device, that is, a CAS latency (CL).

As shown in FIG. 5, in case that the parallel data is transmitted after divided based on a time division scheme more than twice, a plurality of delayed control signals, which are delayed with an uniform delay amount using the delay unit having a plurality of first delay units 507 connected in serial, can be outputted. For example, in case that 8-bit parallel data is divided four times based on a time-division scheme and transmitted or received at one clock cycle CLK, it is possible to transmit or receive data by dividing 8-bit parallel data four time based on a time division scheme if the delayed control signals outputted from the selectors of the delay unit having the serially connected three first delay units 507 having the delay elements 603, 605, and 607 each having a delay amount corresponding to the one clock cycle and the control signal inputted to the delay unit.

Although FIG. 6 shows the first delay unit 507 that considers only three CAS latencies CL, the number of CAS latencies CL may vary according to design thereof.

Figure 7:
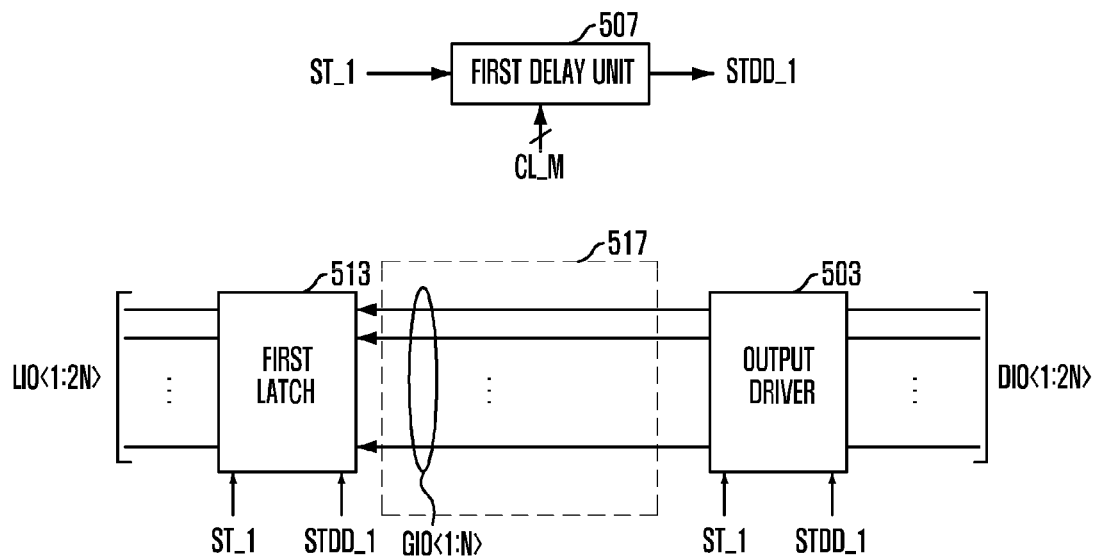
FIG. 7 is a diagram illustrating a data transmitting and receiving circuit of FIG. 5 for describing a write operation.
Figure 8:
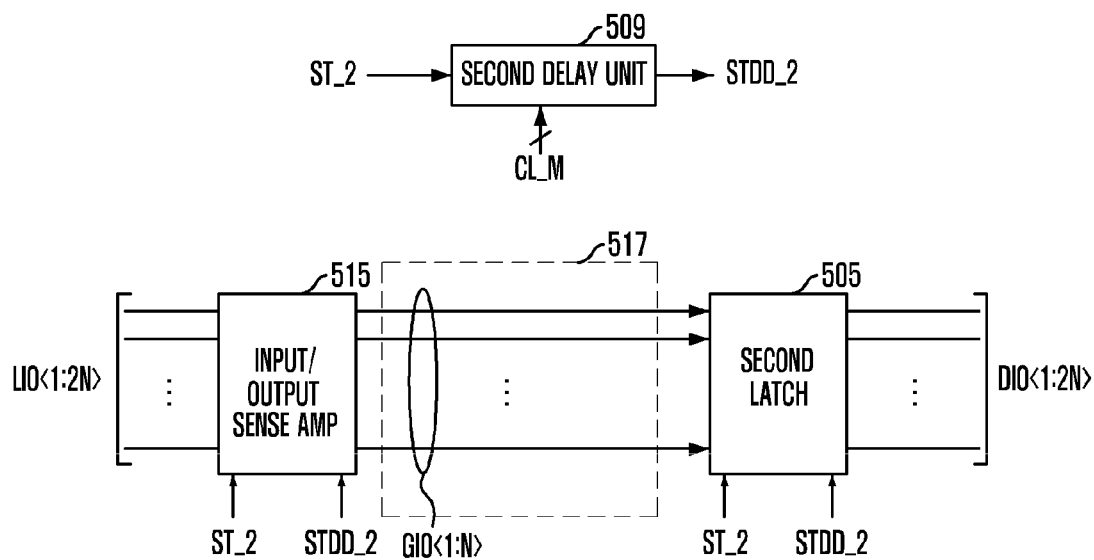
FIG. 8 is a diagram for describing a read operation of a data transmitting and receiving circuit of FIG. 5.

FIGS. 7 and 8 are diagrams illustrating a data transmitting and receiving circuit of FIG. 5 for describing a write operation and a read operation.

FIG. 7 is a diagram for describing a write operation of a semiconductor memory device. As shown, the data transmitting and receiving circuit according to the present embodiment includes a second transmitting and receiving unit 511 having a first latch 513, a first transmitting and receiving unit 501 having an output driver 503, and a parallel data line unit 517, and a first delay unit 507.

Data inputted to a semiconductor memory device from an external device in serial is prefetched to 2N-bit in a pipe latch (not shown) of an input/output interface. The pipe latch transmits the 2-bit prefetched parallel data to the first line DIO<1:2N> in response to a predetermined strobe signal.

The first delay unit 507 generates a first delayed control signal STDD_1 by delaying a first control signal ST_1 obtained from the predetermined strobe signal. The first delay unit 507 delays the first control signal ST_1 with a predetermined delay amount in response to a CAS latency CL. For example, if the semiconductor memory device employs a 8-bit prefetch method, the first control signal ST_1 is enabled, and the first delayed control signal STDD_1 is enabled after two clock cycles CLK.

The output driver 503 receives 2N-bit prefetched parallel data, divides the 2N-bit parallel data based on a time division scheme in response to the first control signal ST_1 and the first delayed control signal STDD_1, and outputs N-bit parallel data. Therefore, the parallel data line unit 517 may include N transmission lines GIO<1:N>, not 2N.

The first latch unit 513 sorts N-bit parallel data to 2N-bit parallel data by latching the N-bit parallel data that is time-divided and transmitted in response to the control signal ST_1 and the first delayed control signal STDD_1. Then, when a write driver (not shown) is enabled, the 2N-bit parallel data is stored in a memory cell.

FIG. 8 is a diagram illustrating a data transmitting and receiving circuit for describing a read operation of a semiconductor memory device. As shown in FIG. 8, the data transmitting and receiving circuit includes a second transmitting and receiving unit 511 having an input/output sense amp 515, a first transmitting and receiving unit 501 having a second latch 203, a parallel data line unit 517, and a second delay unit 509.

If a column is selected by a predetermined column selection signal, 2N bit parallel data is inputted to the input/output sense amp 515 from a memory cell.

The second delay unit 509 generates a second delayed control signal STDD_2 by delaying a second control signal ST_2 obtained from the predetermined column selection signal. The second delay unit 509 delays the first control signal ST_1 as much as a predetermined delay amount in response to a CAS latency CL. For example, a semiconductor memory device employs 8-bit prefetch method, a first delayed control signal is enabled when two clock cycles pass after a first control signal ST_1 is enabled.

The input/output sense amp 515 receives 2N-bit parallel data, divides the 2N-bit parallel data based on a time-division scheme in response to the second control signal ST_2 and the second delayed control signal STDD_2, and consecutively output N-bit parallel data. Therefore, the parallel data line unit 105 may include N transmission lines GIO<1:N> instead of 2N transmission lines.

The second latch unit 505 sorts N-bit parallel data to 2N-bit parallel data by latching the N-bit parallel data in response to the second control signal ST_2 and the delayed control signal STDD_2 and outputs the 2N-bit parallel data to an input/output interface (not shown). The second latch unit 505 may be enabled in response to a control signal having an enable timing faster than that of the second control signal ST_2 in order to latch the N-bit parallel data from the input/output sense amp 515 without delay. In this case, it is preferable to delay a control signal having a faster enable timing than the second control signal ST_2 by further including a delay unit having the same structure of the second delay unit 509.

Figure 9:
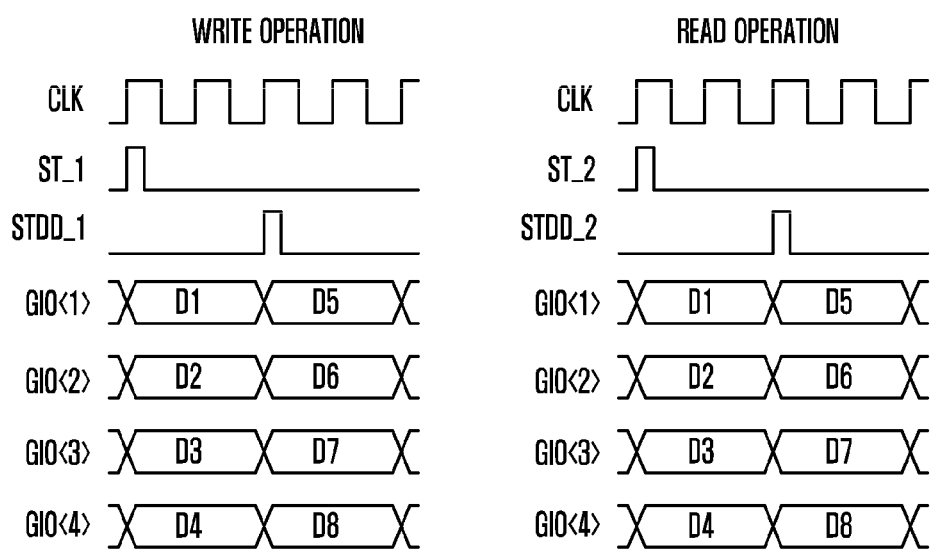
FIG. 9 is a timing diagram for describing a write operation of a data transmitting and receiving circuit of FIGS. 7 and 8.

FIG. 9 is a timing diagram for describing a write operation and a read operation of a data transmitting and receiving circuit of FIGS. 7 and 8 which employs 8-bit prefetch method at a low frequency where N=4.

In a write operation, the first delay unit 507 enables a first delayed control signal STDD_1 by delaying the first control signal as much as two clock cycles in response to a CAS latency CL. Therefore, margins of 4-bit parallel data D1 to D8, which are divided based on a time division scheme and transmitted, are uniform In a read operation, the second delay unit 509 enables a second delay control signal STDD_2 by delaying the second control signal ST_2 as much as two clock cycles in response to the CAS latency CL unlike the delay unit according to the related art. Therefore, margins of 4-bit parallel data D1 to D8, which are divided based on a time division scheme and transmitted, are uniform.

Hereinbefore, the present invention was described in a view of an apparatus. However, the operation of each constituent element in the data transmitting and receiving circuit according to the present invention can be understood in a view of process. Therefore, the operation of each constituent element of the data transmitting and receiving circuit according to the present invention can be understood as each process step of a data transmitting and receiving method according to the present invention. Hereinafter, a data transmitting and receiving method according to an embodiment of the present invention will be described with reference to FIGS. 5 to 9.

The data transmitting and receiving method according to the present embodiment includes a delay step, a transmitting step, a receiving step, and a sorting step, where a sorting step may include dividing parallel data into one or more groups of divided parallel data, or combining one or more groups of divided parallel data into parallel data.

Since the CAS latency CL is decided according to an operation frequency of a semiconductor memory device, a control signal ST is delayed in response to the CAS latency CL and a delayed control signal STDD is outputted in the delay step of read and write operations of the semiconductor memory device. The control signal ST and the delay control signal STDD decide a timing for time division in the transmitting step and the receiving step.

In the transmitting step, 2N bit of first parallel data DATA1<1:2N> is divided based on a time division scheme twice in response to the control signal ST and the delayed control signal STDD and transmitted as N bit of second parallel data DATA2<1:N>.

In the receiving step, N bit of the second parallel data DATA2<1:N> is divided based on a time division scheme twice in response to the control signal ST and the delayed control signal STDD and received.

In the sorting step, N-bit of the second parallel data DATA2<1:N> is sorted to 2N-bit of the first parallel data DATA1<1:2N> by storing N-bit of the second parallel data DATA2<1:N>.

Therefore, margins of the second parallel data DATA2<1:N> are uniform.

The delay step includes generating a plurality of delayed control signals by delaying control signals ST, and selecting one of the plurality of delayed control signals according to a CAS latency CL. Since the CAS latency increases as the operation frequency of the semiconductor memory device increases, the selected delay amount of the delayed control signal STDD is in inverse proportion to the CAS latency CL.

Embodiments of the present invention relate to a data transmitting and receiving circuit and a control method thereof. The data transmitting and receiving circuit according to the present invention determines a frequency of a clock according to a CAS latency, divides the parallel data based on a time division scheme, and transmits and receives the divided parallel data. Therefore, margins of the time-divided and transmitted parallel data are uniformly sustained, and power consumption for measuring a frequency of a clock is reduced.

While the present invention has been described with respect to the specific embodiments, it will be apparent to those skilled in the art that various changes and modifications may be made without departing from the spirit and scope of the invention as defined in the following claims.

What is claimed is:

1. A data receiving circuit, comprising:
   a delay unit for delaying a control signal based on a CAS latency and to output a delayed control signal;
   an output driver, said output driver being configured to time-divide parallel data based on the control signal and the delayed control signal to generate divided parallel data, and to write and transmit the divided parallel data; and
   a latch configured to receive the divided parallel data from the output driver in response to the control signal and the delayed control signal and to combine the divided parallel data.

2. The data receiving circuit of claim 1, wherein the delay unit includes:
   a delay signal generator for generating a plurality of delayed control signals by delaying the control signal by different delay amounts; and
   a selector for selecting one selected control signal among the plurality of delayed control signals according to the CAS latency.

3. The data receiving circuit of claim 2, wherein the delay amount of the selected control signal is in inverse proportion to the CAS latency.

4. The data receiving circuit of claim 1, wherein the number of bits of the divided parallel data is half of the number of bits of the parallel data.

5. A data transmitting circuit, comprising:
   a delay unit for delaying a control signal based on a CAS latency and to generate a delayed control signal;
   an input/output sense amp unit configured to time-divide parallel data based on the control signal and the delayed control signal to generate divided parallel data, and to read and transmit the divided parallel data; and
   a latch configured to receive the divided parallel data from the input/output sense amp unit in response to the control signal and the delayed control signal, and to combine the divided parallel data.

6. The data transmitting circuit of claim 5, wherein the delay unit includes:
   a delay signal generator for generating a plurality of delayed control signal by delaying the control signal by different delay amounts; and a selector for selecting one selected control signal among the plurality of delayed control signals according to the CAS latency.

7. The data transmitting circuit of claim 6, wherein the delay amount of the selected delayed control signal is in inverse proportion to the CAS latency.

8. The data transmitting circuit of claim 5, wherein the number of bits of the transmitted parallel data is half of the number of bits of the divided parallel data.

9. A data transmitting and receiving circuit, comprising:
a first delay unit for delaying a first control signal in response to a CAS latency and to generate a first plurality of delayed control signals;
a second delay unit for delaying a second control signal in response to the CAS latency to generate a second plurality of delayed control signals; and
a data transmitting and receiving unit configured to time-divide the first and second parallel data in response to the control signal and the plurality of delayed control signals.

10. The data transmitting and receiving circuit of claim 9, wherein the data transmitting and receiving unit includes:
a parallel data line unit configured to bi-directionally transmit data;
a first transmitting and receiving unit configured to time-divide the first parallel data in response to the first control signal and the first plurality of delay control signals, to generate first divided parallel data, and to transmit the first divided parallel data to the parallel data line unit, and configured to receive the first parallel data from the parallel data line unit in response to the second control signal and the second plurality of delayed control signals; and
a second transmitting and receiving unit configured to time-divide the second parallel data in response to the second control signal and the second plurality of second delay control signals, to generate second divided parallel data, and to transmit the second divided parallel data to the parallel data line unit, and configured to receive the second parallel data from the parallel data line unit in response to the first control signal and the first plurality of delayed control signals.

11. The data transmitting and receiving circuit of claim 10, wherein
the first delay unit includes a first delay signal generator for generating a first plurality of delayed control signals by delaying the first control signal by different delay amounts, and a first selector for selecting at least one of the first plurality of delayed control signals, including first selected delayed control signal, according to the CAS latency; and
the second delay unit includes a second delay signal generator for generating a second plurality of delayed control signals by delaying the second control signal by different delay amounts, and a second selector for selecting at least one of the second plurality of delayed control signals, including a second selected delayed control signal, according to the CAS latency.

12. The data transmitting and receiving circuit of claim 11, wherein the delay amount of the first selected delayed control signal and the second selected delayed control signal are in inverse proportion to the CAS latency.

13. The data transmitting and receiving circuit of claim 10, wherein the first transmitting and receiving unit includes:
an output driver configured to transmit a portion of the first parallel data in response to each of the control signal and the first plurality of delayed control signals; and
a first latch configured to latch and divide the first parallel data from the parallel data line unit in response to the second control signal and the second plurality of control signals.

14. The data transmitting and receiving circuit of claim 10, wherein the second transmitting and receiving unit includes:
an input/output sense amp configured to transmit a portion of the second parallel data in response to each of the second control signal and the second plurality of delay control signals; and
a second latch configured to latch and combine the second parallel data transmitted to the parallel data line unit in response to the first control signal and the first plurality of delayed control signals.

15. The data transmitting and receiving circuit of claim 10, wherein the number of bits of data transmitted to the parallel data line unit is in inverse proportion to the number of delayed control signals outputted from the delay unit.

16. A data transmitting and receiving method, comprising:
delaying a control signal based on a CAS latency to generate a delayed control signal;
time-dividing first parallel data in response to the control signal and the delayed control signal to generate second parallel data;
transmitting the second parallel data;
receiving the second parallel data in response to the control signal and the delayed control signal; and
combining the second parallel data and the first parallel data by storing the second parallel data.

17. The data transmitting and receiving method of claim 16, wherein the delaying a control signal includes:
delaying the control signal by different amounts to generate a plurality of delayed control signals; and
selecting one selected delay control signal among the plurality of delay control signals according to the CAS latency.

18. The data transmitting and receiving method of claim 17, wherein the delay amount of the selected delay control signal is in inverse proportion to the CAS latency.

* * * * *